(12) United States Patent
Boerstler

(10) Patent No.: US 6,822,484 B1
(45) Date of Patent: Nov. 23, 2004

(54) HIGH-FREQUENCY PHASE/FREQUENCY DETECTOR WITH IMPROVED RESET MECHANISM

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/606,583

(22) Filed: Jun. 26, 2003

(51) Int. Cl.[7] .............................................. H01R 25/00
(52) U.S. Cl. .......................................... 327/3; 327/149
(58) Field of Search ............................... 327/3, 5, 7, 8, 327/9, 12, 147, 149, 150, 153, 156, 158, 159

(56) References Cited

U.S. PATENT DOCUMENTS 6,127,866 A * 10/2000 Chu et al. .................... 327/158
6,239,634 B1 * 5/2001 McDonagh .................. 327/158
2001/0016476 A1 * 8/2001 Kasahara et al. ........... 455/260

* cited by examiner

*Primary Examiner*—Linh My Nguyen
(74) *Attorney, Agent, or Firm*—Carr LLP; Robert M. Carwell

(57) ABSTRACT

The present invention provides a method and an apparatus for generating a phase error signal from a reference signal and a feedback signal using a modified reset generation mechanism. An input circuit receives a reference signal and a feedback signal. A phase error detector circuit generates a phase error signal based on the reference signal and feedback signal. The input circuit is reset and, after a delay, the phase error detector circuit is reset. The delay is selected so that there is no jitter associated with the dead zone.

23 Claims, 7 Drawing Sheets

HIGH-FREQUENCY PHASE/FREQUENCY DETECTOR WITH IMPROVED RESET MECHANISM

BACKGROUND OF THE INVENTION

1. Field of the Invention

The invention relates generally to a phase-lock loop (PLL) circuit, and more particularly to reducing jitter in a PLL operating at high frequencies.

2. Description of the Related Art

A phase-lock loop (PLL) is typically used to synchronize ('lock') an internal voltage-controlled oscillator (VCO) to an external reference signal. A PLL thus keeps a circuit operating at a specific frequency, and is used in a wide variety of electronic circuits for this purpose.

One of the key components of a PLL is a phase-frequency detector (PFD) circuit, which compares the VCO signal to the reference signal and generates a phase error signal that is a measure of their phase difference. The VCO generates a periodic signal with a frequency that is controlled by the phase error signal. The VCO output is coupled to the feedback input of the PFD, thereby forming a feedback loop. If the frequency of the feedback signal is not equal to the frequency of the reference signal, the phase error signal causes the VCO frequency to shift toward the frequency of the reference signal, until the VCO finally locks onto the frequency of the reference.

For very small phase differences, for example when the PLL is in a steady-state condition, the dead zone is the region in which the phase error signal is insensitive to phase-difference changes. Thus one problem with a PFD is that jitter is introduced into the loop due to the dead zone. Most approaches to minimizing the dead zone are particularly complicated, and do not allow the PFD to operate at high frequencies with zero dead zone.

Therefore, there is a need for a phase/frequency detector that operates in high frequency circuits with zero dead zone.

SUMMARY OF THE INVENTION

The present invention provides a method and an apparatus for generating a phase error signal from a reference signal and a feedback signal using a modified reset generation mechanism. An input circuit receives a reference signal and a feedback signal. A phase error detector circuit generates a phase error signal based on the reference signal and feedback signal. The input circuit is reset and, after a delay, the phase error detector circuit is reset. The delay is selected so that there is no jitter associated with the dead zone.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be apparent to those skilled in the art that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered to be within the understanding of persons of ordinary skill in the relevant art.

In the remainder of this description, a processing unit (PU) may be a sole processor of computations in a device. In such a situation, the PU is typically referred to as am MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
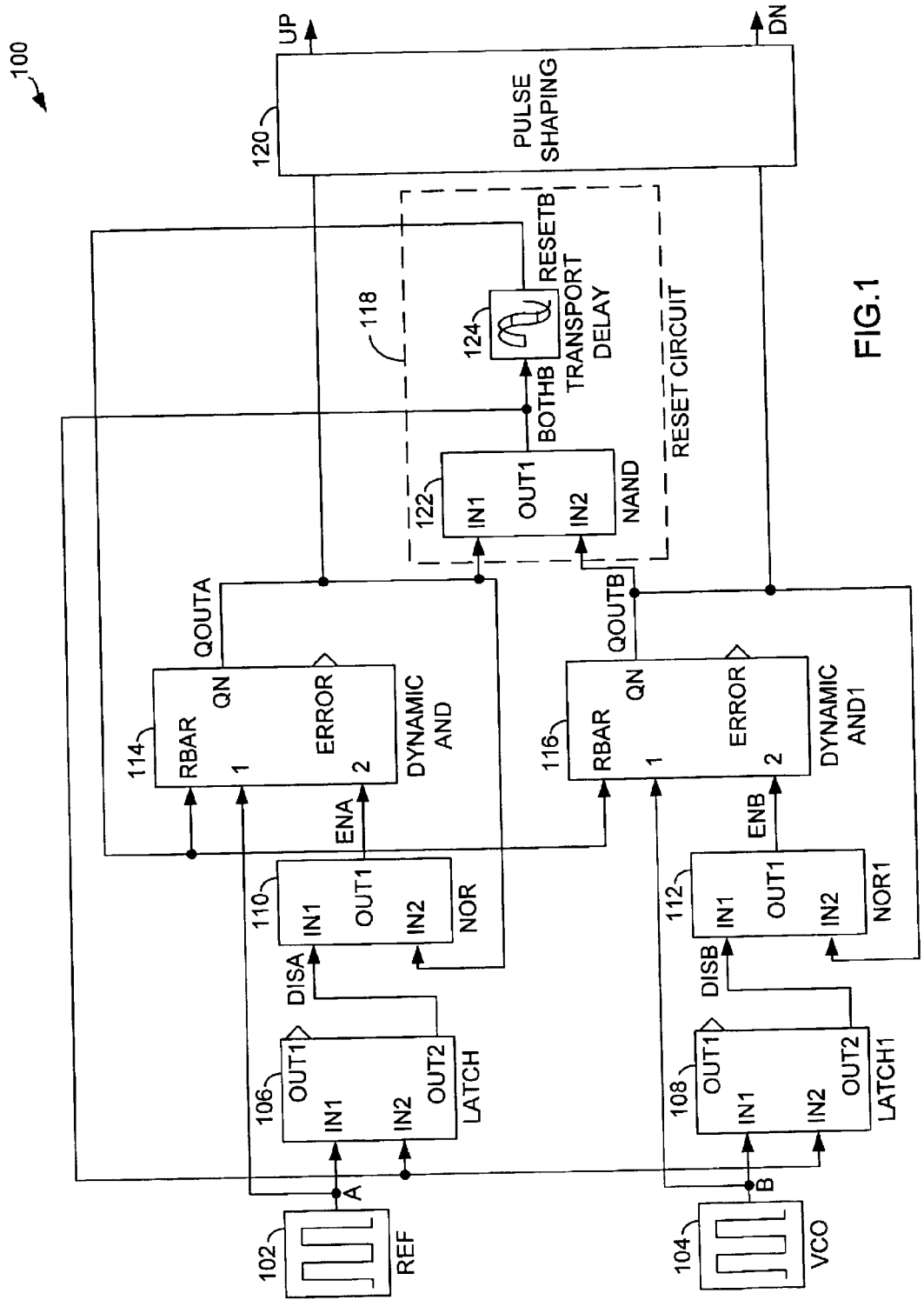
FIG. 1 is a block diagram of a high frequency phase/frequency detector.

Referring to FIG. 1 of the drawings, the reference numeral 100 generally designates a phase/frequency detector (PFD). The circuit 100 comprises two inputs 102 and 104 for receiving a reference signal and a feedback signal, respectively, two latches 106 and 108, two NOR gates 110 and 112, two dynamic AND circuits 114 and 116, a reset circuit 118 and a pulse shaping circuit 120 with two outputs.

Latch circuit 106 is shown to receive a reference signal from input 102 and a first reset signal (bothb) and to generate a latched reference signal (disa). Latch circuit 108 is shown to receive a feedback signal from input 104 and the first reset signal (bothb) and to generate a latched feedback signal (disb). When there is no input present, the output (disa) for latch circuit 106 is low. When the reference signal input to latch circuit 106 goes high, the latched reference signal output goes high and remains high until latch circuit 106 receives a first reset signal. Latch circuit 108 behaves similarly.

NOR circuit 110 is coupled to the first latch circuit 106 for receiving the latched reference signal (disa) and a derived reference signal (qouta) and for generating a first NOR signal. NOR circuit 112 is coupled to the second latch circuit 108 for receiving the latched feedback signal (disb) and a derived feedback signal (qoutb) and for generating a second NOR signal. When both inputs to NOR circuit 110 are low, the output of NOR circuit 110 is high. As is well known in the art, if either or both inputs of a NOR circuit are high, the output for the NOR circuit is low, and only when both inputs are low is the NOR circuit output high. Both NOR circuits 110 and 112 behave this way.

Dynamic AND circuit 114 receives the reference signal from input 102 and is coupled to the first NOR circuit 110 for receiving the first NOR signal. Dynamic AND circuit 114 is also configured to receive a second reset signal and to generate the derived reference signal. The second reset signal is a delayed signal of the first reset signal. Dynamic AND circuit 116 is shown to receive the feedback signal from input 104 and is coupled to NOR circuit 112 for receiving the second NOR signal. Dynamic AND circuit 116 is also configured to receive the second reset signal and to generate the derived feedback signal. As is well known in the art, the output of an AND circuit is high only when all inputs to the AND circuit are high, and the output is low when one or more of the inputs is low. Both dynamic AND circuits 114 and 116 behave this way.

Reset circuit 118 is coupled to first and second dynamic AND circuits 114 and 116 for receiving the derived reference signal and derived feedback signal, respectively, and coupled to the first and second latch circuits 106 and 108 for generating the first reset signal. The reset circuit 118 is also coupled to first and second dynamic AND circuits 114 and 116 for providing the second reset signal. When the derived reference signal and the derived feedback signal both go high, the first reset signal is output, and after a delay tau, the second reset signal is output. The delay tau is proportional to the period of the reference signal and may be varied between 5% to 25% of the period of the reference signal. For simplicity, the delay tau may be fixed at 10% of the period of the reference signal, for example 25 picoseconds for a 4 GHz clock.

Pulse shaping circuit 120 is coupled to dynamic AND circuits 114 and 116 for receiving the derived reference signal and derived feedback signal, respectively, and configured for generating first and second output pulses, wherein, if the reference signal arrives before the feedback signal, the first output pulse UP has a duration which is proportional to a time delay between the reference signal and the feedback signal, and if the feedback signal arrives before the reference signal, the second output pulse DN has a duration which is proportional to a time delay between the reference signal and the feedback signal. Pulse shaping circuit 120 has a dead zone associated with very small phase differences between the reference signal and the feedback signal and a means for reducing the dead zone by changing the durations of the first and second output pulses. The pulse shaping circuit used in the present invention is well known in the art.

Initially, the PFD is waiting for input. If the reference signal arrives first, the PFD circuit sets itself, using the derived reference signal (qouta), NOR circuit 110, and the first NOR signal (ena), to ignore input 102, and waits for the feedback signal to arrive. Similarly, if the feedback signal arrives first, the PFD circuit sets itself, using the derived feedback signal (qoutb), NOR circuit 112 and the second NOR signal (enb), to ignore input 104, and waits for the reference signal to arrive. Once both the reference signal and the feedback signal have arrived, the phase error between the two signals is detected.

Once the phase error is detected, two events occur at substantially the same time. First, the phase error is sent to pulse shaping circuit 120. Second, reset circuit 118 issues a first reset signal to latches 106 and 108 and, after a delay, a second reset signal to dynamic ANDs 114 and 116. The two reset signals cause the PFD to reset to its initial stage so that the cycle can begin again.

Figure 2:
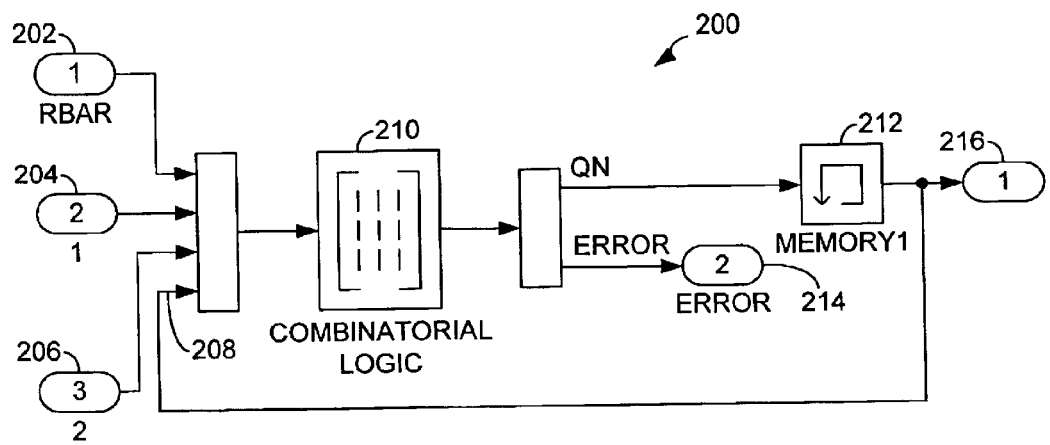
FIG. 2 is a block diagram of a dynamic AND circuit.

Now referring to FIG. 2, the reference numeral 200 generally designates a dynamic AND circuit comprising inputs 202, 204, 206 and 208, combinatorial logic 210, memory 212, error output 214 and output 216. The combinatorial logic circuit 210 is shown to receive the second reset signal at input 202, the reference signal at input 204, the first NOR signal at input 206, and the derived reference signal 208, and is configured for generating a clogic signal if successful in logically combining inputs 202, 204, 206, and 208, and a clogic error signal if unsuccessful. The memory circuit 212 is coupled to the first combinatorial logic circuit for receiving the clogic signal and generating the derived reference signal. Error output 214 is coupled to combinatorial logic circuit 210 for receiving a clogic error signal.

Figure 3:
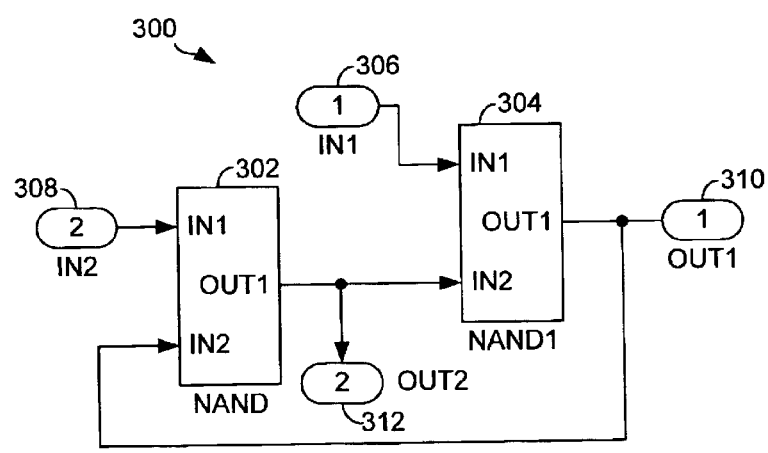
FIG. 3 is a block diagram of a latch circuit.

Now referring to FIG. 3, the reference numeral 300 generally designates a latch circuit comprising NAND circuits 302 and 304, inputs 306 and 308 and outputs 310 and 312. NAND circuit 302 is configured to receive the first reset signal at input 308 and a first latch enable signal, and to generate a first latch disable signal, which is coupled to output 312. NAND circuit 304 is coupled to the first NAND circuit for receiving the first latch disable signal and coupled to input 306 for receiving an input signal and generating a first latch enable signal, which is coupled to output 310 and coupled to the input of NAND 302. Input 306 is typically coupled to either a reference signal or a feedback signal.

Figure 4:
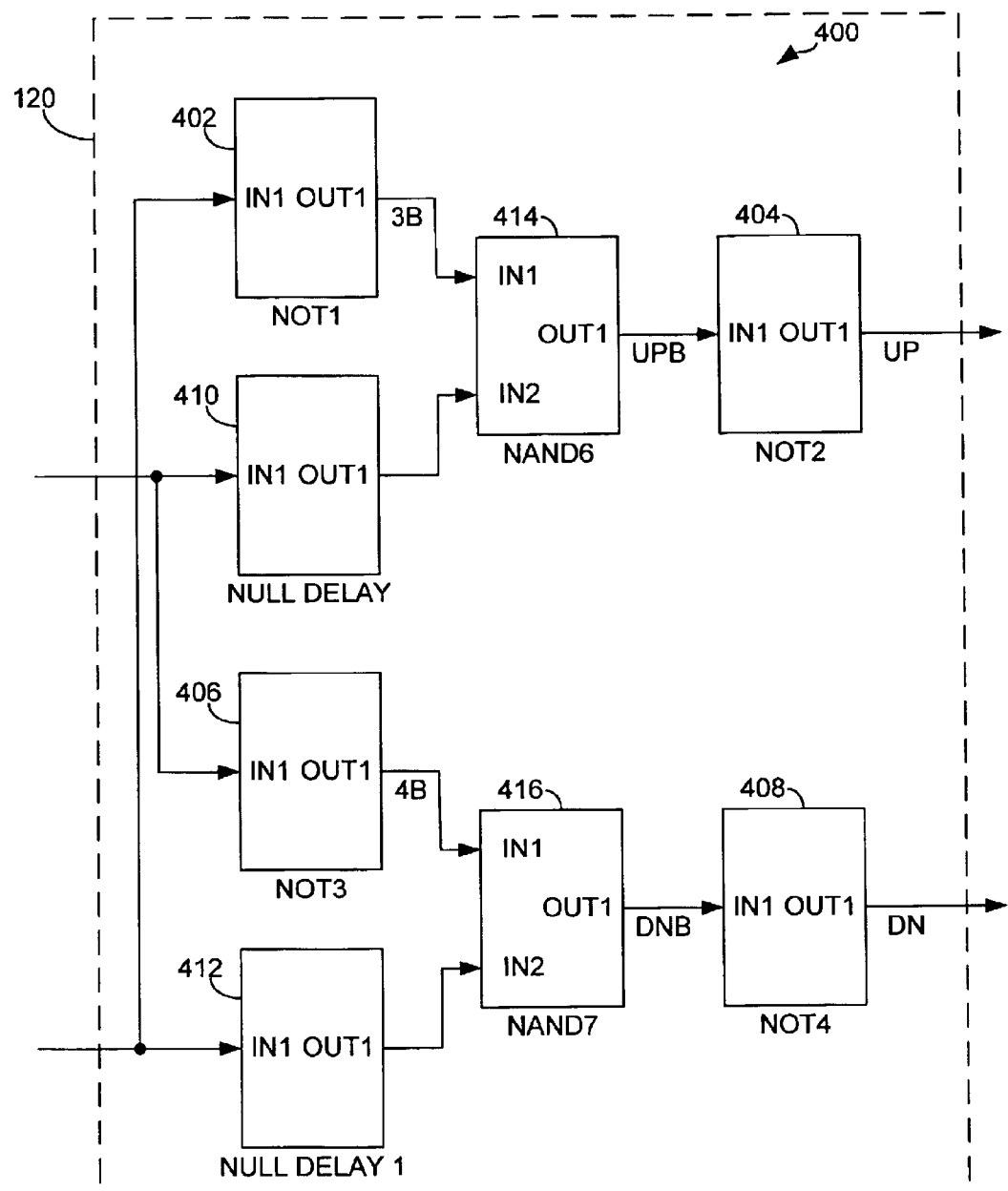
FIG. 4 is a block diagram of a pulse shaping circuit.

Now referring to FIG. 4, the reference numeral 400 generally designates a pulse shaping circuit comprising two inputs for receiving a derived reference signal and a derived feedback signal, NOT circuits 402, 404, 406, and 408, null delay circuits 410 and 412, NAND circuits 414 and 416, and two outputs UP and DN. If the reference signal arrives before the feedback signal, the pulse shaping circuit generates a pulse at output UP with pulse width proportional to the delay between the reference signal and feedback signal. If the feedback signal arrives before the reference signal, the pulse shaping circuit generates a pulse at output DN with pulse width proportional to the delay between the reference signal and feedback signal.

In the pulse shaping circuit, NOT circuit 402 is coupled to dynamic AND circuit 116 for receiving the derived feedback signal and generating a first NOT feedback signal. Null delay circuit 410 is coupled to dynamic AND 114 for receiving the derived reference signal and generating a delayed reference signal. NAND circuit 414 is coupled to NOT circuit 402 and null delay circuit 410 for receiving the first NOT feedback signal and the delayed reference signal, respectively, and generating a UPB signal. NOT circuit 404 is coupled to NAND circuit 414 for receiving the UPB signal and generating an UP signal. NOT circuit 406 is coupled to dynamic AND circuit 114 for receiving the derived reference signal and generating a first NOT reference signal. Null delay circuit 412 is coupled to dynamic AND circuit 116 for receiving the derived feedback signal and generating a delayed feedback signal. NAND circuit 416 is coupled to NOT circuit 406 and null delay circuit 412 for receiving the first NOT reference signal and the delayed feedback signal, respectively, and generating a DNB signal. NOT circuit 408 is coupled to NAND circuit 416 for receiving the DNB signal and generating a DN signal.

Figure 5A:
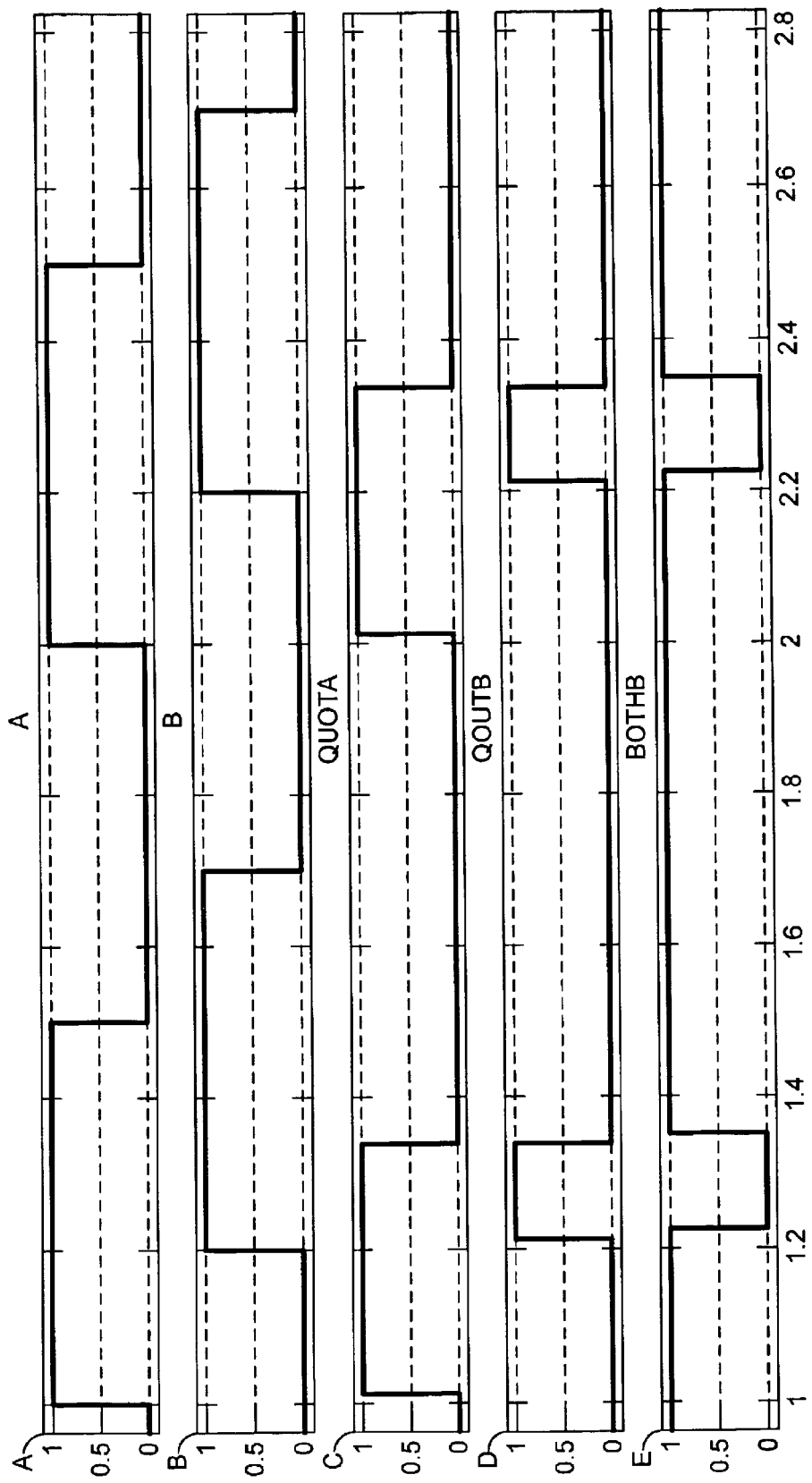
FIGS. 5A and 5B are timing diagrams showing the status of various inputs and outputs when signal A arrives before signal B.
Figure 5B:
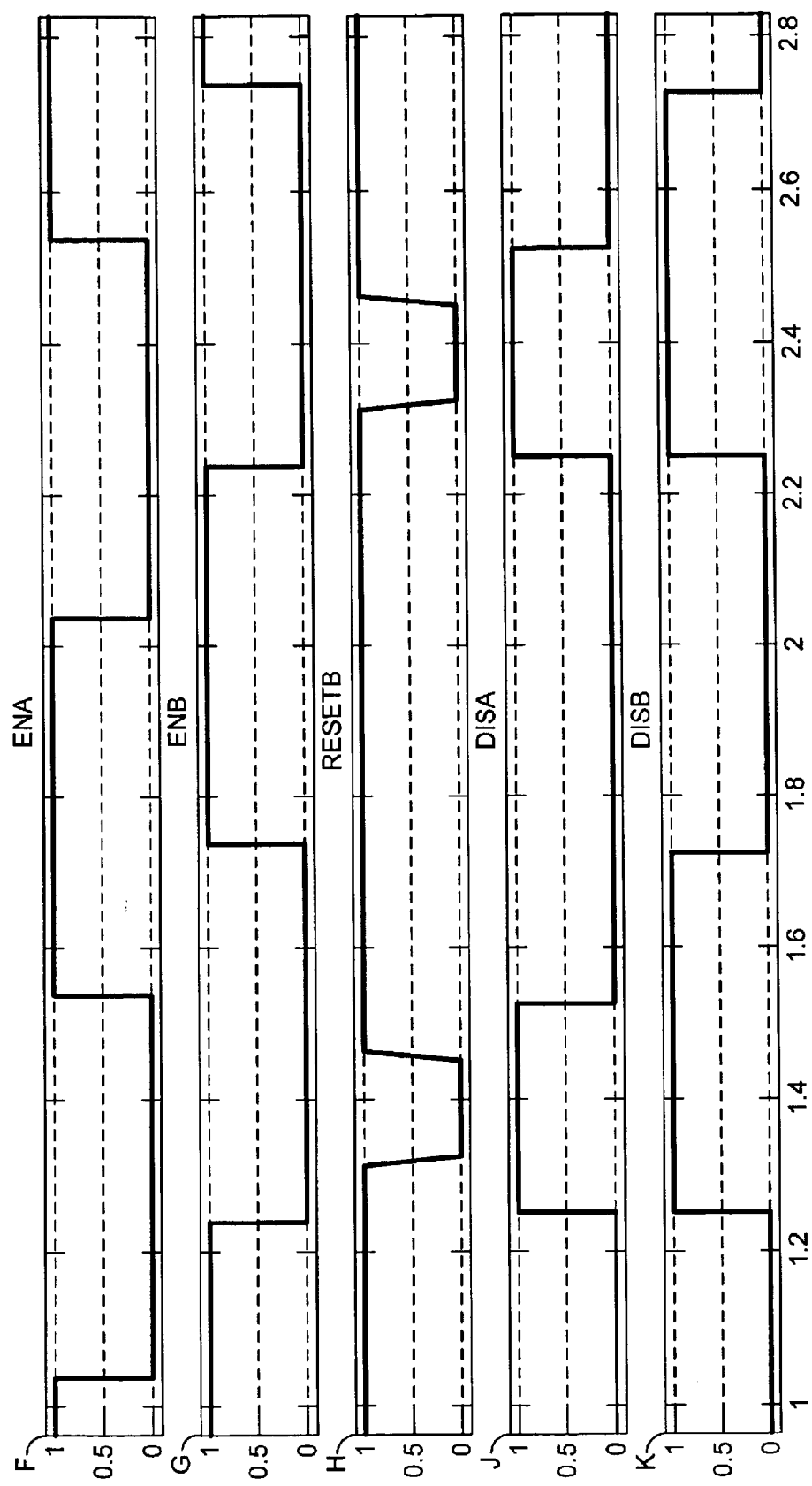

Now referring to FIGS. 5A and 5B, a timing diagram is shown, illustrating arrival of the reference signal before the feedback signal. When the reference signal arrives at input 102, the output of dynamic AND circuit 114, the derived reference signal, goes high and disables dynamic AND circuit 114. Dynamic AND circuit 114 is disabled as a result of the output of NOR circuit 110, the first NOR signal, going low in response to the derived reference signal going high. When a feedback signal arrives at input 104, the output of dynamic AND circuit 116, the derived feedback signal, goes high and disables dynamic AND circuit 116. Dynamic AND circuit 116 is disabled as a result of the output of NOR circuit 112, the second NOR signal, going low in response to the derived feedback signal going low. Once the derived reference signal and the derived feedback signal are both high, pulse shaping circuit 120 generates a pulse at output UP, with width proportional to the delay between the reference signal and feedback signal. At the same time, when the derived reference signal and derived feedback signal are both high, the output of NAND circuit 122 goes low generating the first reset signal, causing the latched reference signal and latched feedback signal to go high, holding the first and second NOR signals low.

After the first reset signal is generated, transport delay 124 generates the second reset signal, causing dynamic AND circuits 114 and 116 to reset and the derived reference signal and derived feedback signal to go low. Once input 102 goes low, the latched reference signal goes low, causing the first NOR signal to go high, enabling dynamic AND 114 for the next time input 102 goes high. Similarly, once input 104 goes low, the latched feedback signal goes low, causing the second NOR signal to go high, enabling dynamic AND 116 for the next time input 104 goes high. The cycle is complete and the process repeats for subsequent cycles.

Figure 6A:
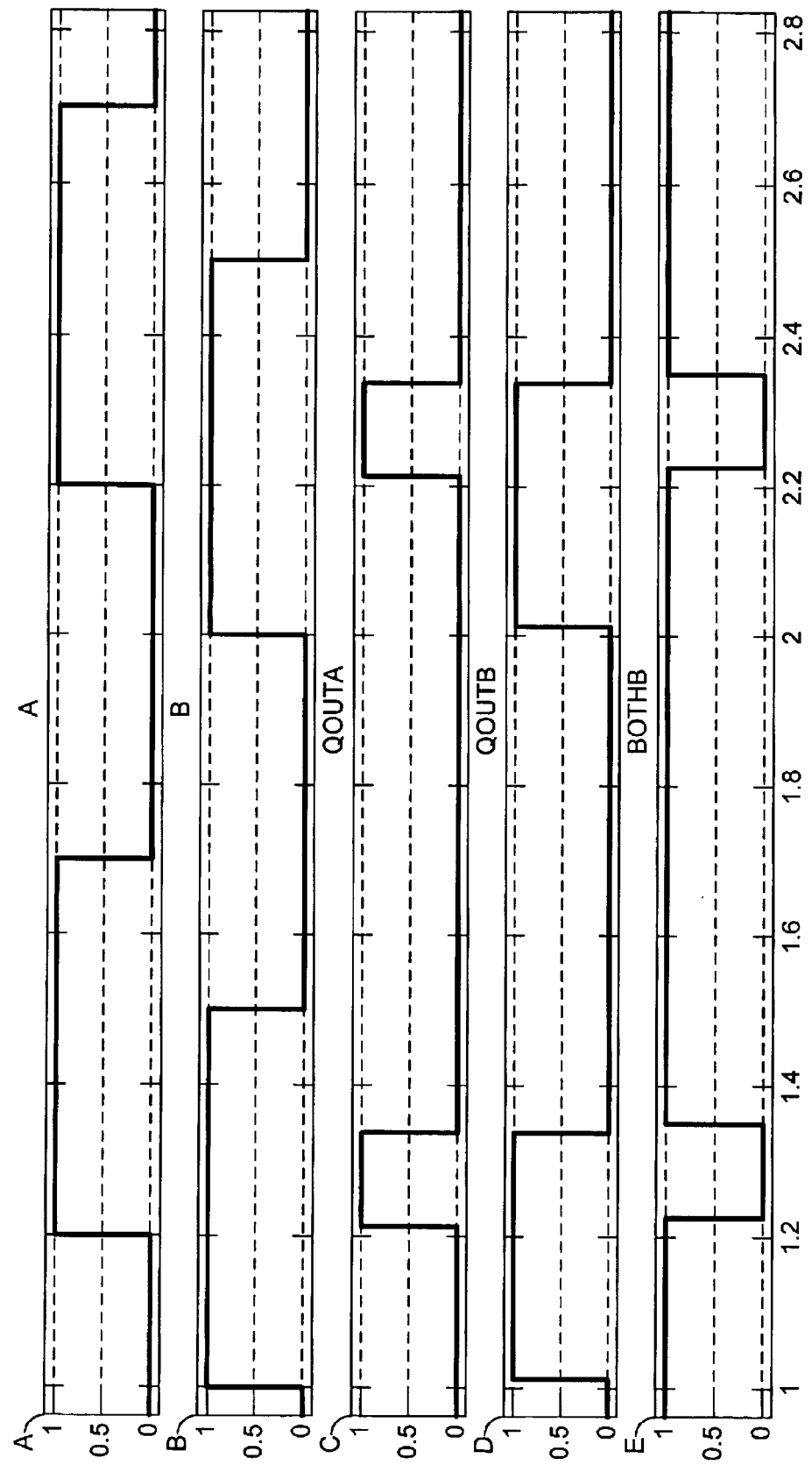
FIGS. 6A and 6B are timing diagrams showing the status of various inputs and outputs when signal B arrives before signal A.
Figure 6B:
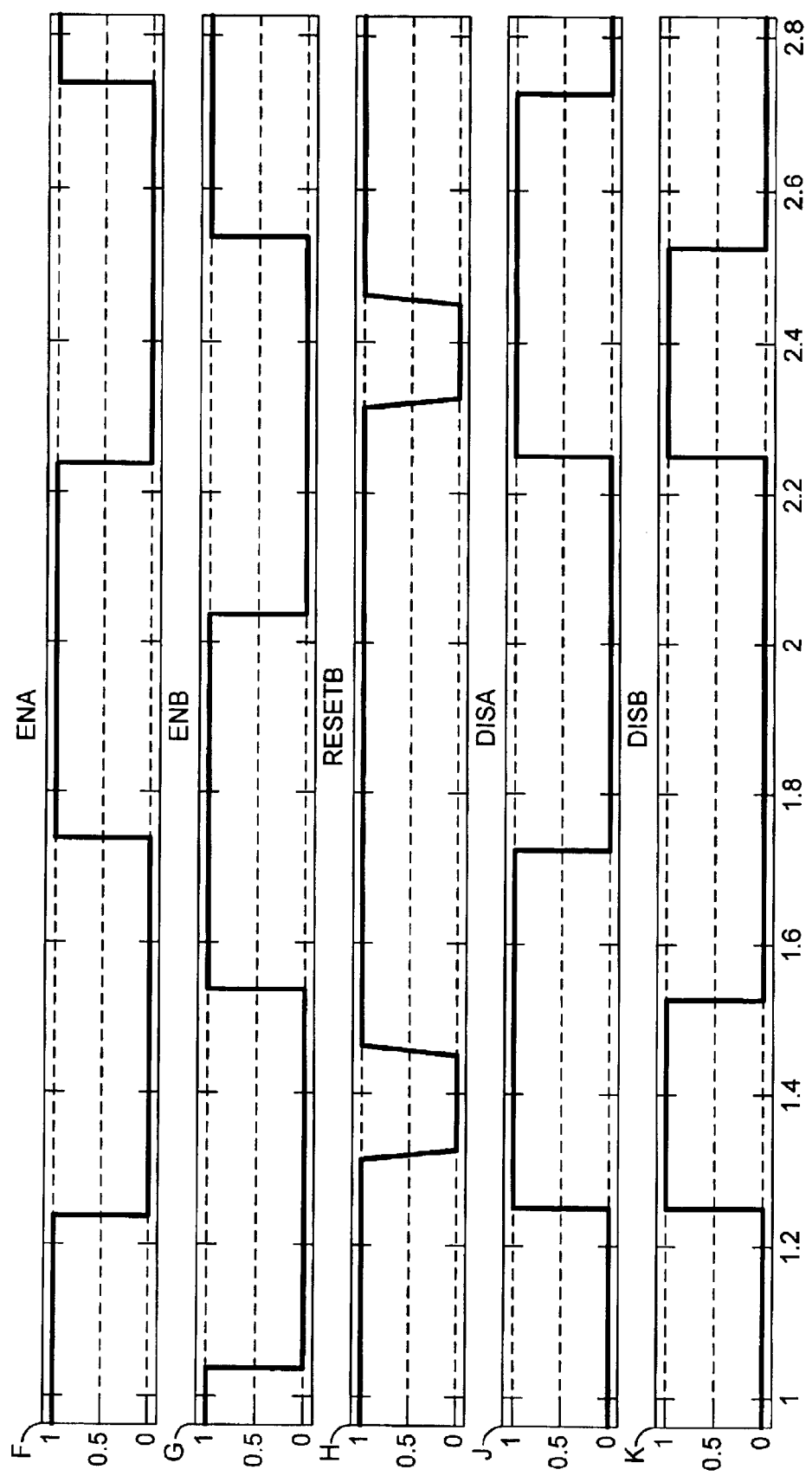

Now referring to FIGS. 6A and 6B, a timing diagram is shown, illustrating arrival of the feedback signal before the reference signal. When the feedback signal arrives at input 104, it causes the derived feedback signal to go high, disabling dynamic AND circuit 116 because of the second NOR signal going low. Once the reference signal arrives at input 102, it similarly disables dynamic AND 114. When both the derived feedback signal and the derived reference signal are high, pulse shaping circuit 120 generates a pulse at output DN, with width proportional to the delay between the feedback signal and reference signal. At the same time, when both the derived feedback signal and the derived reference signal are high, the first reset signal is generated, resetting latches 106 and 108, and then the second reset signal is generated, resetting dynamic AND 114 and 116.

The present invention, allows a PFD to achieve zero dead zone in high speed circuits by using a modified, dual-stage reset mechanism. The dual-stage nature of the reset allows for a highly responsive reset. One application of this feature is constructing a PLL for use in a high-speed clock circuit with little or no dead zone. Achievable is a dead zone of less than one picosecond at cycle times of less than 5 FO4 delays.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A method of generating a phase error signal from a reference signal and a feedback signal, the method comprising the steps of:
   receiving the reference signal and the feedback signal using an input circuit;
   generating the phase error signal, at least based on the reference signal and the feedback signal, using a phase error detector circuit, wherein the phase error detector circuit further comprises a first and second dynamic AND circuit; and
   resetting the input circuit and, after a delay, resetting the phase error detector circuit, wherein the amount of delay is variable and is used to select an appropriate amount of delay to reduce a dead zone to less than one picosecond, and wherein the amount of delay is variable from 5% to 25% of the period of the reference signal.

2. The method of claim 1 wherein the amount of delay is temporarily set at an amount appropriate to reduce the dead zone to less than one picosecond.

3. The method of claim 2 wherein the amount of delay is temporarily set at a value between 5% and 25% of the period of the reference signal.

4. A method of generating a phase error signal from a reference signal and a feedback signal, the method comprising the steps of:
   setting a first and a second latch circuit after receiving the reference signal and the feedback signal, respectively, and generating a latched reference signal and a latched feedback signal, respectively, until a first reset signal is received;
   generating a derived reference signal and a derived feedback signal, based on the reference signal and the feedback signal, respectively, using a first and second dynamic AND circuit, respectively, until a second reset signal is received;
   receiving the derived reference signal and the derived feedback signal in a reset circuit and generating the first reset signal and, after a delay, generating the second reset signal; and
   generating a pulse, in a pulse shaping circuit, based on the derived reference signal and the derived feedback signal, with pulse width proportional to the delay between the derived reference signal and the derived feedback signal.

5. The method of claim 4 wherein the amount of delay is variable and is used to select an appropriate amount of delay to reduce a dead zone to less than one picosecond.

6. The method of claim 5 wherein the amount of delay is variable from 5% to 25% of the period of the reference signal.

7. The method of claim 4 wherein the amount of delay is temporarily set at an amount appropriate to reduce the dead zone to less than one picosecond.

8. The method of claim 7 wherein the amount of delay is temporarily set at a value between 5% and 25% of the period of the reference signal.

9. An apparatus for generating a phase error signal from a reference signal and a feedback signal, the apparatus comprising:
   means for setting a first and second latch after receiving the reference signal and the feedback signal, respectively, and for generating a latched reference signal and a latched feedback signal, respectively, until a first reset signal is received;
   means for generating a derived reference signal and a derived feedback signal, based on the reference signal and feedback signal, respectively, until a second reset signal is received;
   means for receiving the derived reference signal and the derived feedback signal in a reset circuit, for generating the first reset signal, and after a delay, for generating the second reset signal; and
   means for receiving the derived reference signal and the derived feedback signal in a pulse shaping circuit, and for generating a pulse with width proportional to the delay between the derived reference signal and the derived feedback signal.

10. The apparatus of claim 9 wherein the amount of delay is variable relative to the period of the reference signal and is used to select an amount of delay appropriate to reduce the dead zone to less than one picosecond.

11. The apparatus of claim 10 wherein the amount of delay is variable from 5% to 25% of the period of the reference signal.

12. The apparatus of claim 9 wherein the amount of delay is temporarily set at an amount appropriate to reduce the dead zone to less than one picosecond.

13. The method of claim 12 wherein the amount of delay is temporarily set at a value between 5% and 25% of the period of the reference signal.

14. A computer program product for generating a phase error signal from a reference signal and a feedback signal, the computer program product having a medium with a computer program embodied thereon, the computer program comprising:

computer program code for setting a first and second latch after receiving the reference signal and the feedback signal, respectively, and for generating a latched reference signal and a latched feedback signal, respectively, until a first reset signal is received;

computer program code for generating a derived reference signal and a derived feedback signal, based on the reference signal and the feedback signal, respectively, until a second reset signal is received;

computer program code for receiving the derived reference signal and the derived feedback signal, for generating the first reset signal, and after a delay proportional to the period of the reference signal, for generating the second reset signal; and computer program code for receiving the derived reference signal and the derived feedback signal in a pulse shaping circuit, and for generating a pulse that has a width proportional to the delay between the derived reference signal and the derived feedback signal.

15. The computer program code of claim 14 wherein the amount of delay is variable and is used to select an appropriate amount of delay to reduce the dead zone to less than one picosecond.

16. The computer program code of claim 15 wherein the amount of delay is variable from 5% to 25% of the period of the reference signal.

17. The computer program code of claim 14 wherein the amount of delay is temporarily set at an amount appropriate to reduce the dead zone to less than one picosecond.

18. The computer program code of claim 17 wherein the amount of delay is temporarily set at a value between 5% and 25% of the period of the reference signal.

19. A phase/frequency detector circuit, comprising:

a first latch circuit configured for receiving a reference signal and a first reset signal, and for generating a latched reference signal;

a second latch circuit configured for receiving a feedback signal and a second reset signal, and for generating a latched feedback signal;

a first dynamic AND circuit configured for receiving the reference signal, a first NOR signal and a second reset signal, and for generating a derived reference signal;

a second dynamic AND circuit configured for receiving the feedback signal, a second NOR signal and the second reset signal, and for generating a derived reference signal;

a first NOR circuit coupled to the first latch circuit for receiving the latched reference signal and coupled to the first dynamic AND circuit for receiving the derived reference signal, and for generating the first NOR signal;

a second NOR circuit coupled to the second latch circuit for receiving the latched feedback signal and coupled to the second dynamic AND circuit for receiving the derived feedback signal, and for generating the second NOR signal;

a reset circuit coupled to the first and second dynamic AND circuits configured for receiving the derived reference signal and the derived feedback signal, respectively, and coupled to the first and second latch circuits for providing the first reset signal, and further coupled to the first and second dynamic AND circuits for providing a second reset signal, after a delay proportional to the period of the reference signal; and a pulse shaping circuit coupled to the first and second dynamic AND circuits configured for receiving the derived reference signal and the derived feedback signal, respectively, and generating a pulse that has a width proportional to the delay between the derived reference signal and the derived feedback signal.

20. The phase/frequency detector circuit of claim 19 wherein the amount of delay is variable and is used to select an appropriate amount of delay to reduce the dead zone to less than one picosecond.

21. The phase/frequency detector circuit of claim 20 wherein the amount of delay is variable from 5% to 25% of the period of the reference signal.

22. The phase/frequency detector circuit of claim 19 wherein the amount of delay is temporarily set at an amount appropriate to reduce the dead zone to less than one picosecond.

23. The phase/frequency detector circuit of claim 22 wherein the amount of delay is temporarily set at a value between 5% and 25% of the period of the reference signal.

* * * * *